United States Patent
Sakano et al.

(10) Patent No.: US 8,042,722 B2
(45) Date of Patent: Oct. 25, 2011

(54) CONDUCTIVE BALL ARRAYING APPARATUS

(75) Inventors: Tatsuya Sakano, Ishikawa (JP); Yasukazu Nishi, Ishikawa (JP); Kazuo Niizuma, Ishikawa (JP)

(73) Assignee: Shibuya Kogyo Co., Ltd., Kanazawa-shi, Ishikawa-ken (JP)

( * ) Notice: Subject to any disclaimer, the term of this patent is extended or adjusted under 35 U.S.C. 154(b) by 1189 days.

(21) Appl. No.: 11/790,835

(22) Filed: Apr. 27, 2007

(65) Prior Publication Data

US 2007/0251722 A1 Nov. 1, 2007

(30) Foreign Application Priority Data

Apr. 28, 2006 (JP) ................ P2006-124951
Apr. 28, 2006 (JP) ................ P2006-124952

(51) Int. Cl.
*B23K 15/02* (2006.01)
(52) U.S. Cl. ............ 228/8; 414/288; 414/293; 414/289; 228/41
(58) Field of Classification Search ............ 414/222.02, 414/288, 289, 293, 295, 296, 403, 298; 438/48; 228/41, 245, 246
See application file for complete search history.

(56) References Cited

U.S. PATENT DOCUMENTS

| | | | | |
|---|---|---|---|---|
| 5,224,811 A | * | 7/1993 | Sigrist et al. | 414/289 |
| 5,615,823 A | * | 4/1997 | Noda et al. | 228/103 |
| 5,655,704 A | * | 8/1997 | Sakemi et al. | 228/246 |
| 6,253,992 B1 | * | 7/2001 | Fjelstad | 228/245 |
| 6,255,132 B1 | * | 7/2001 | Fujimura | 438/48 |
| 6,268,275 B1 | * | 7/2001 | Cobbley et al. | 438/612 |
| 7,635,079 B1 | * | 12/2009 | Cobbley et al. | 29/740 |
| 2003/0110626 A1 | * | 6/2003 | Cobbley et al. | 29/840 |
| 2004/0035908 A1 | * | 2/2004 | Bourrieres et al. | 228/49.6 |
| 2005/0230001 A1 | * | 10/2005 | Monti | 141/129 |

FOREIGN PATENT DOCUMENTS

| | | |
|---|---|---|
| JP | 08-118005 | 5/1996 |
| JP | 08-236916 | 9/1996 |
| JP | 3271482 | 1/2002 |
| JP | 2003-243440 | 8/2003 |

* cited by examiner

*Primary Examiner* — Saul Rodriguez
*Assistant Examiner* — Glenn Myers
(74) *Attorney, Agent, or Firm* — Drinker Biddle & Reath LLP

(57) ABSTRACT

A conductive ball arraying apparatus includes an arraying jig having ball insertion parts at a predetermined array pattern, a ball cup that has an opening part on a lower surface thereof and is capable of housing a plurality of conductive balls, moving means that moves the arraying jig and the ball cup relatively and moves the ball cup relatively along an upper surface of the arraying jig and dropping off the conductive balls into the ball insertion parts of the arraying jig. The apparatus includes means for detecting a quantity of the conductive balls in the ball cup and detects as to whether the quantity of the conductive balls in the ball cup reaches at least one of an upper limit and a lower limit and/or means for detecting leakage of the conductive balls from a clearance between the ball cup and the arraying jig.

12 Claims, 4 Drawing Sheets

CONDUCTIVE BALL ARRAYING APPARATUS

This application claims priority from Japanese Patent Applications No. 2006-124951 filed on Apr. 28, 2006 and 2006-124952 filed on Apr. 28, 2006, the entire subject matter of which is incorporated herein by reference.

BACKGROUND OF THE INVENTION

1. Field of the Invention

The present invention relates to improvement of an apparatus in which a ball cup that houses conductive balls therein moves relatively on an arraying jig having ball insertion parts provided at a predetermined pattern so as to array conductive balls. The conductive ball arraying apparatus of the invention has been developed in order to control exactly a quantity of the conductive balls in the ball cup. Further, the conductive ball arraying apparatus of the invention has been developed in order to detect conductive balls that have leaked out from a clearance between the ball cup and the arraying jig.

2. Description of the Related Art

In a solder ball mounter which mounts solder balls on individual electrodes formed on a mounting object at the predetermined array pattern, recently, since the size of the solder ball becomes minute and the size of the product such as a wafer that is the mounting object becomes large, the number of solder balls to be mounted at one time has increased. Under such the circumstances, in order to reduce a defect in arraying the solder balls and a defect in the mounting time, Japanese Patent No. 3271482 discloses a conductive ball arraying apparatus, in which an arraying jig (template in Japanese Patent No. 3271482) such as an array mask is provided on an electronic substrate which is a mounting object on which flux has been printed, and a ball cup (solder ball housing part) moves above the arraying jig and drops the solder ball directly on the electrode of the electronic substrate.

However, in this conductive ball arraying apparatus, if the number of the conductive balls in the ball cup is too large during arraying the ball, there is the danger that the conductive ball at the bottom of the ball cup that comes into contact of the arraying jig is pressed or held by the surrounding conductive balls thereby not to be dropped or to cause engagement. In contrast, if the number of the conductive balls in the ball cup is too small, there is the danger of a shortage of conductive balls.

Further, in this conductive ball arraying apparatus, if tension of the arraying jig is not appropriate, plane accuracy is poor, or setting of height position of the ball cup in relation to the arraying jig is not appropriate, the conductive balls in the ball cup may leak out from a portion between the ball cup and the arraying jig during the ball array operation. The leakage of the conductive balls deteriorates the product on which the conductive balls are mounted.

SUMMARY OF THE INVENTION

In order to continue the stable arraying operation, it may be considered to keep appropriately the quantity of balls housed in the ball cup. For example, the appropriate quantity of balls in the ball cup may be calculated and secured from the opening/closing time of an opening and closing door provided in a ball hopper that is a ball feeder and the ball supplying quantity, and the number of production sheets and the elapsed production time. However, there is a problem that the actual ball quantity in the ball cup deviates from the calculated and grasped ball quantity gradually with the elapsed time.

Aspects of the invention provide a conductive ball arraying apparatus which can control a ball quantity in a ball cup more exactly by detecting the ball quantity by detection means.

Further, aspects of the invention provide a conductive ball arraying apparatus which can detect conductive balls which have leaked out from a portion between a ball cup and an arraying jig.

According to a first aspect of the invention, a conductive ball arraying apparatus comprises: an arraying jig having ball insertion parts at a predetermined array pattern; a ball cup that has an opening part on a lower surface thereof and is capable of housing a plurality of conductive balls; moving means that moves the arraying jig and the ball cup relatively, the moving means moving the ball cup relatively along an upper surface of the arraying jig and dropping off the conductive balls into the ball insertion parts of the arraying jig; upper limit detection means and lower limit detection means that detect a quantity of the conductive balls in the ball cup and detects as to whether the quantity of the conductive balls in the ball cup reaches an upper limit and a lower limit, respectively, when the moving means moves the arraying jig and the ball cup relatively; and leakage detection means that detects leakage of the conductive balls from a clearance between the ball cup and the arraying jig on a back side in a relative movement direction of the ball cup.

According to a second aspect of the invention, the moving means is movable reciprocately, and the upper limit detection means, lower limit detection means and the leakage detection means each includes two sets thereof such that they are opposed to each other in a moving direction of the ball cup, each sets of the upper limit detection means, the lower limit detection means and the leakage detection means being alternately switched in accordance with the moving direction of the ball cup.

According to a third aspect of the invention, a conductive ball arraying apparatus comprises: an arraying jig having ball insertion parts at a predetermined array pattern; a ball cup that has an opening part on a lower surface thereof and is capable of housing a plurality of conductive balls; moving means that moves the arraying jig and the ball cup relatively, the moving means moving the ball cup relatively along an upper surface of the arraying jig and dropping off the conductive balls into the ball insertion parts of the arraying jig; and lower limit detection means that detects a quantity of the conductive balls in the opening part in a vicinity of an inner wall of the ball cup on a side which the ball cup moves and detects as to whether the quantity of the conductive balls in the ball cup reaches the lower limit when the moving means moves the arraying jig and the ball cup relatively.

According to a fourth aspect of the invention, the conductive ball arraying apparatus further comprises a ball supply means that supplies the conductive balls into the ball cup, wherein the ball supply means resupplies the conductive balls when the lower limit detection means detects the reaching of the lower limit.

According to a fifth aspect of the invention, the moving means is movable reciprocately, and the lower limit detection means includes two sets of the lower limit detection means such that they are opposed to each other in the moving direction of the ball cup, each sets of the lower limit detection means being alternately switched in accordance with a moving direction of the ball cup.

According to a sixth aspect of the invention, the lower limit detection means detects the quantity of the conductive balls in the ball cup from light quantity of reflection light from the conductive balls.

According to a seventh aspect of the invention, a conductive ball arraying apparatus comprises: an arraying jig having ball insertion parts at a predetermined array pattern; a ball cup that has an opening part on a lower surface thereof and is capable of housing a plurality of conductive balls; moving means that moves the arraying jig and the ball cup relatively, the moving means moving the ball cup relatively along an upper surface of the arraying jig and dropping off the conductive balls into the ball insertion parts of the arraying jig; and upper limit detection means that detects a quantity of the conductive balls in a vicinity of an inner wall surface of the ball cup on a side opposite to which the ball cup moves and detects as to whether the quantity of the conductive balls in the ball cup reaches the upper limit when the moving means moves the arraying jig and the ball cup relatively.

According to an eighth aspect of the invention, the moving means is movable reciprocately, and the upper limit detection means includes two sets of the upper limit detection means such that they are opposed to each other in the moving direction of the ball cup, each sets of the upper limit detection means being alternately switched in accordance with the moving direction of the ball cup.

According to a ninth aspect of the invention, the upper limit detection means detects the quantity of the conductive balls in the ball cup from light quantity of reflection light from the conductive balls.

According to a tenth aspect of the invention, a conductive ball arraying apparatus comprises: an arraying jig having ball insertion parts at a predetermined array pattern; a ball cup that has an opening part on a lower surface thereof and is capable of housing a plurality of conductive balls; moving means that moves the arraying jig and the ball cup relatively, the moving means moving the ball cup relatively along an upper surface of the arraying jig and dropping off the conductive balls into the ball insertion parts of the arraying jig; and detection means that detects a quantity of the conductive balls in the ball cup and detects as to whether the quantity of the conductive balls in the ball cup reaches an upper limit and a lower limit when the moving means moves the arraying jig and the ball cup relatively.

According to an eleventh aspect of the invention, the moving means is movable reciprocately, and the detection means includes two sets thereof such that they are opposed to each other in a moving direction of the ball cup, each sets of the detection means being alternately switched in accordance with the moving direction of the ball cup.

According to a twelfth aspect of the invention, there is provided a conductive ball arraying apparatus comprising: an arraying jig having ball insertion parts at a predetermined array pattern; a ball cup that has an opening part opposed to the upper surface of the arraying jig on a lower surface thereof and is capable of housing a plurality of conductive balls; moving means that moves the arraying jig and the ball cup relatively, the moving means moving the ball cup relatively along an upper surface of the arraying jig and dropping off the conductive balls into the ball insertion parts of the arraying jig; and leakage detection means that detects leakage of the conductive balls from a clearance between the ball cup and the arraying jig on a back side in a relative movement direction of the ball cup.

According to a thirteenth aspect of the invention, the leakage detection means includes two sets thereof such that they are alternately switched in accordance with a moving direction of the ball cup.

According to a fourteenth aspect of the invention, the conductive ball arraying apparatus further comprises alarm means that activates an alarm when the leakage detection means detects the leakage of the conductive balls.

According to a fifteenth aspect of the invention, the conductive ball arraying apparatus further comprises stopping means that stops the arraying operation when the leakage detection means detects the leakage of the conductive balls.

According to the aspects of the invention, the upper limit detection means and the lower detection means that detect the quantity of the conductive balls in the ball cup and detects as to whether the quantity of the conductive balls in the ball cup reaches the upper limit and the lower limit, respectively, when the moving means moves the arraying jig and the ball cup relatively. Therefore, the ball quantity can be always controlled appropriately.

Further, according to the aspects of the invention, the moving means is movable reciprocately, and the upper limit detection means and lower limit detection means each includes two sets thereof such that they are opposed to each other in the moving direction of the ball cup, each sets of the upper limit detection means and the lower limit detection means being alternately switched in accordance with the moving direction of the ball cup. Therefore, also in the apparatus which places the conductive balls by the reciprocating movement, the ball quantity can be controlled exactly.

Still further, according to the aspects of the invention, the detection means includes the lower limit detection means that detects a quantity of the conductive balls in the opening part in the vicinity of the inner wall of the ball cup on the side which the ball cup moves and detects as to whether the quantity of the conductive balls in the ball cup reaches the lower limit when the moving means moves the arraying jig and the ball cup relatively. Therefore, the necessary time of resupply can be detected and the ball quantity can be controlled exactly.

Still further, according to the aspects of the invention, the conductive ball arraying apparatus further comprises the ball supply means that supplies the conductive balls into the ball cup, wherein the ball supply means resupplies the conductive balls when the lower limit detection means detects the reaching of the lower limit. Therefore, it becomes easy to make the ball quantity in the ball cup appropriate at all times.

Still further, according to the aspects of the invention, the moving means is movable reciprocately, and the lower limit detection means includes two sets of the lower limit detection means such that they are opposed to each other in the moving direction of the ball cup, each sets of the lower limit detection means being alternately switched in accordance with the moving direction of the ball cup. Therefore, also in the apparatus which places the conductive balls by the reciprocating movement, the ball quantity can be controlled exactly.

Still further, according to the aspects of the invention, the detection means includes the upper limit detection means that detects the quantity of the conductive balls in the vicinity of the inner wall surface of the ball cup on the side opposite to which the ball cup moves and detects as to whether the quantity of the conductive balls in the ball cup reaches the upper limit when the moving means moves the arraying jig and the ball cup relatively. Therefore, the apparatus can be controlled to make the ball quantity in the ball cup appropriate when the ball quantity in the ball cup comes to the appropriate quantity or more is possible.

Still further, according to the aspects of the invention, the moving means is movable reciprocately, and the upper limit detection means includes two sets of the upper limit detection means such that they are opposed to each other in the moving direction of the ball cup, each sets of the upper limit detection means being alternately switched in accordance with the moving direction of the ball cup. Therefore, also in the apparatus which places the conductive balls by the reciprocating movement, the ball quantity can be controlled exactly.

Still further, according to the aspects of the invention, the leakage detection means that detects leakage of the conductive balls from the clearance between the ball cup and the arraying jig is provided. Therefore, the conductive balls which have leaked from the portion between the ball cup and the arraying jig can be detected.

Still further, according to the aspects of the invention, the leakage detection means includes two sets thereof such that they are alternately switched in accordance with a moving direction of the ball cup. Therefore, it is possible to detect the conductive balls that have leaked out in case that the ball cup reciprocates.

Still further, according to the aspects of the invention, the alarm means that activates an alarm or the stopping means that stops the arraying operation when the leakage detection means detects the leakage of the conductive balls. Therefore, it is useful for the countermeasure after the leakage of the conductive balls.

DETAILED DESCRIPTION OF THE PREFERRED EMBODIMENTS

Referring to drawings, a mode for carrying out the invention will be described below with an embodiment of the invention. In the embodiment, a solder ball mounter is shown. The solder ball mounter includes a carry-in wafer delivery part, a flux printing part, a ball mounting part, and a carry-out wafer delivery part. A conductive ball arraying apparatus of the invention constitutes the ball mounting part. In the invention, as mounting objects of the conductive ball, there are a semiconductor wafer (hereinafter, simply described as a wafer), an electronic circuit board, a ceramics board, and the like. In the embodiment, the wafer is used for the mounting objects. Further, as adhesive material, flux, solder paste, conductive adhesive, and the like are used. In the embodiment, the flux is used for the adhesive material. The electrodes on the wafer on which the conductive balls are to be mounted have been coated with the flux.

Figure 3:
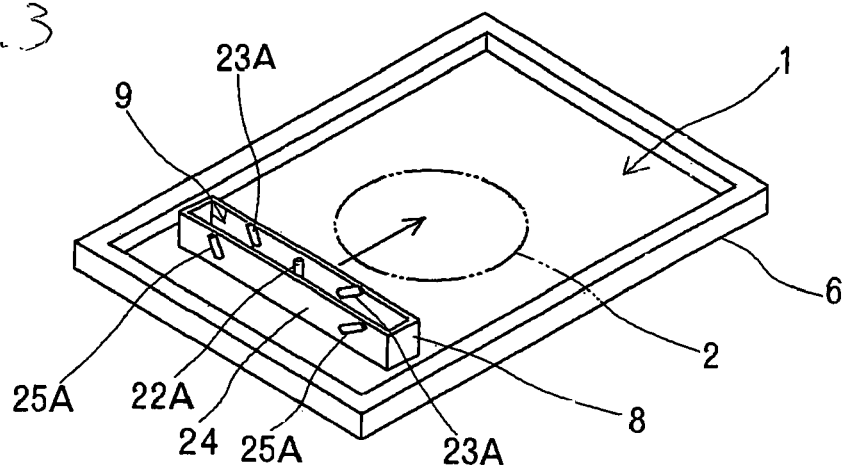
FIG. 3 is an explanatory view of a ball cup, which shows operation detecting sensors.
Figure 4:
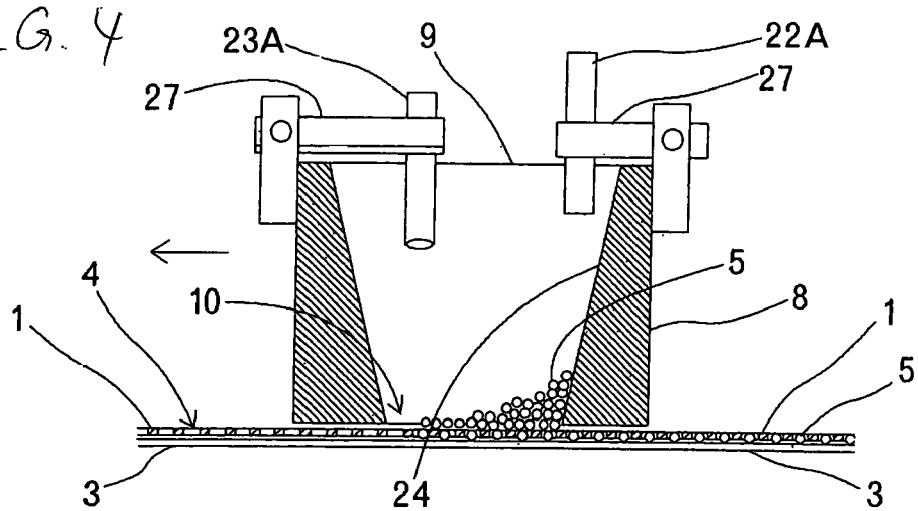
FIG. 4 is an explanatory view of a section of the ball cup, which shows upper limit and lower limit detecting positions.
Figure 5:
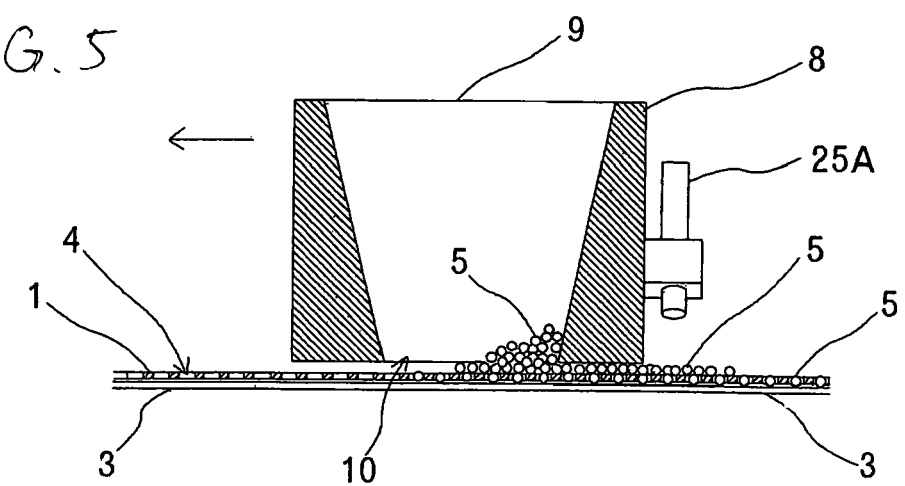
FIG. 5 is an explanatory view of a section of the ball cup, which shows a leakage detecting position.

The ball mounting part has a solder ball feeder 40 and an arraying jig having ball insertion parts at predetermined array pattern. As the arraying jig, a ball array mask 1 is used. In an insertion part forming area 2 of the ball array mask 1 shown in FIGS. 1 and 3, ball insertion parts 4 are arranged and formed according to the pattern of the electrodes on the wafer 3 as shown in FIGS. 4 and 5.

The thickness of the ball array mask 1 is substantially the same as the diameter of a solder ball 5 to be supplied. The diameter of the ball insertion part 4 is slightly larger than the diameter of the solder ball 5. Generally, the array pitch in the lateral direction of the ball insertion part 4 in the ball array mask 1 is about twice the pore diameter of the ball insertion part 4. The ball array mask 1 is attached to a molding box 6 by an applied tension as shown in FIGS. 1 and 3, and is held by a fixed part such as a flame.

Figure 1:
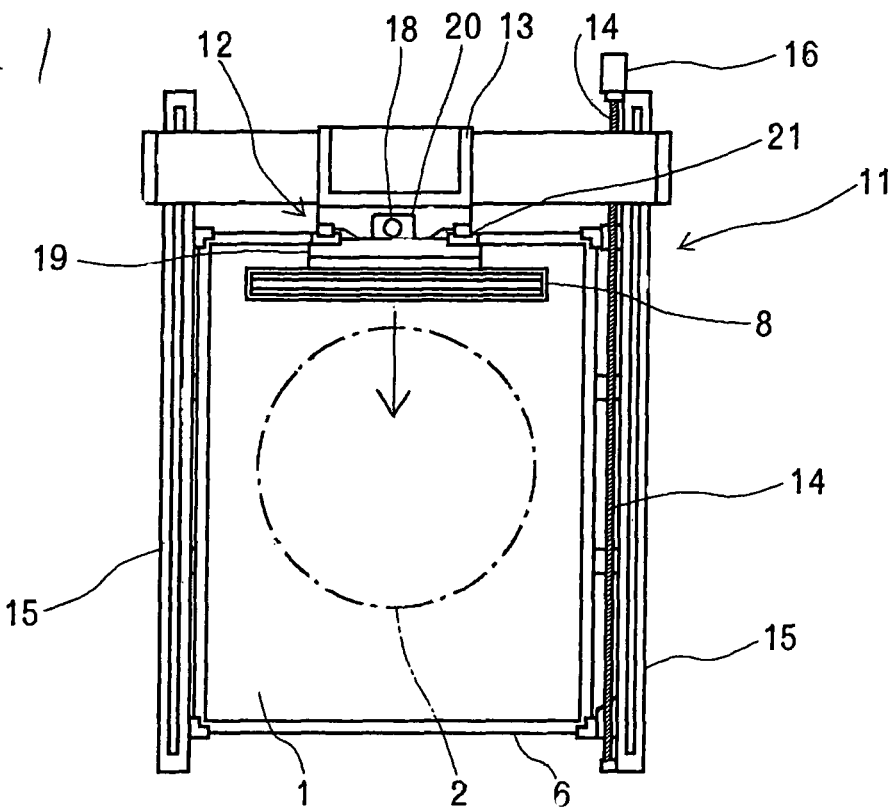
FIG. 1 is a schematic plan view showing the whole of an arraying apparatus according to the invention.
Figure 6:
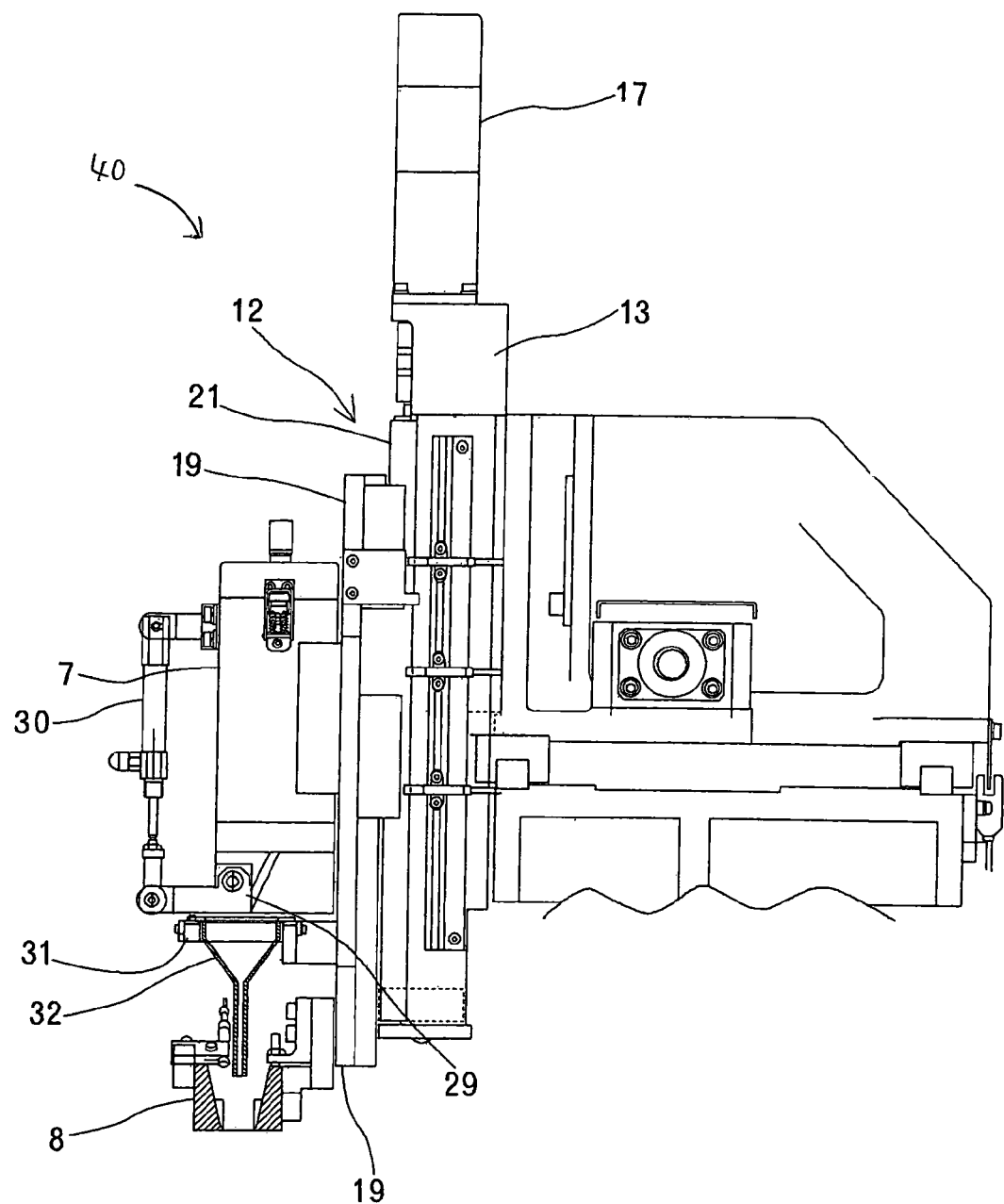
FIG. 6 is an explanatory view of a lateral section, which shows a relation between a ball cup and a ball hopper.
Figure 7:
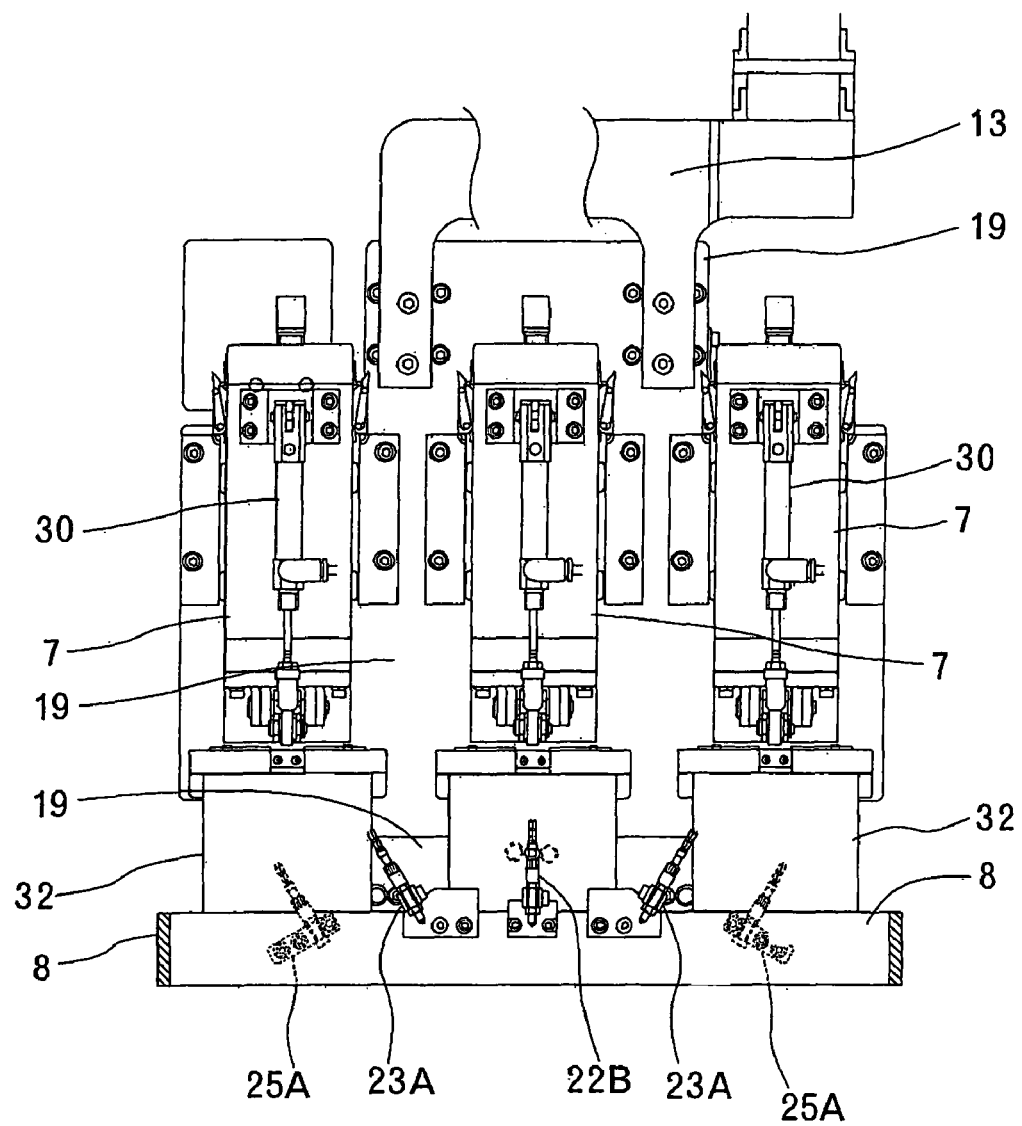
FIG. 7 is a front explanatory view, which shows the same.

As shown in FIGS. 1 and 6, the solder ball feeder 40 includes a ball hopper 7 which houses a large number of solder balls 5, a ball cup 8 which drops the solder ball 5 into the ball insertion part 4 of the ball array mask 1, a ball cup moving means 11 which moves the ball cup 8 forward and backward, and up-down means 12 which moves the ball cup in the Z-axis direction.

The ball cup moving means 11 for this ball cup 8 on a horizontal surface moves back and forth a base member 13 to which the ball cup 8 is attached through the up-down means 12, by a ball screw 14 which rotates by a front and back drive motor 16, along guides 15 on the upper surface of the ball array mask 1. The direction of an arrow in FIG. 1 indicates a front direction. In this movement, the solder ball 5 is dropped into the ball insertion part 4 of the ball array mask 1 from the ball cup 8. The moving means 11 in the embodiment moves in only the forward and backward directions. However, if a lower surface opening part 10 of the ball cup 8 is narrower than the insertion part forming area 2 of the ball array mask 1, for example, additional moving means which moves in the left and right direction may also be provided.

In the ball cup up-down means 12, an attachment base 19 is attached through a nut member 20 to a ball screw 18. The ball screw 18 rotates by a Z-axis drive motor 17 (though not shown in FIG. 1, it is shown in FIG. 6) provided for the base member 13 of the moving means 11 of the ball cup 8. Accordingly, the attachment base 19 can move up and down along up-down guide rails 21.

The ball cup 8 has a rectangular opening part 9 for supplying a ball in an upper portion thereof and the rectangular opening part 10 for dropping the ball on a lower surface thereof. As shown in FIGS. 4 and 5, the ball cup 8 is formed slantingly so as to narrow from the upper opening part 9 toward the lower opening part 10. A width of the lower opening part 10 is wider than a width of the insertion part forming area 2 of the ball array mask 1, and a large number of solder balls 5 can be housed by the ball cup 8 and the upper surface of the ball array mask 1.

As shown in FIGS. 2 to 5, upper limit sensors 22A, 22B, lower limit sensors 23A, 23B and leakage sensors 25A, 25B are attached to the ball cup 8. These sensors use reflection-type fiber sensors. Other sensors such as a light projecting/receiving-type fiber sensor may be used. As shown in FIGS. 3 and 4, the upper limit sensor 22A which works during the ball arraying operation is attached to the upper portion on the inside of a rear wall 24 in the advance direction of the ball cup 8. The arrows in FIGS. 3 and 4 indicate the advance direction of the ball cup 8. In the embodiment, the upper limit sensor which works when the advance direction of the ball cup 8 is reversed is also provided. Therefore, the upper limit sensors 22A and 22B are attached to the front and back center portions inside the ball cup 8. Here, the upper limit sensor 22B works when the ball cup 8 retreats. In other words, two sets of the upper limit sensors, 22A and 22B, are provided for the advance direction and the retreat direction of the movement of the ball cup 8.

Figure 2:
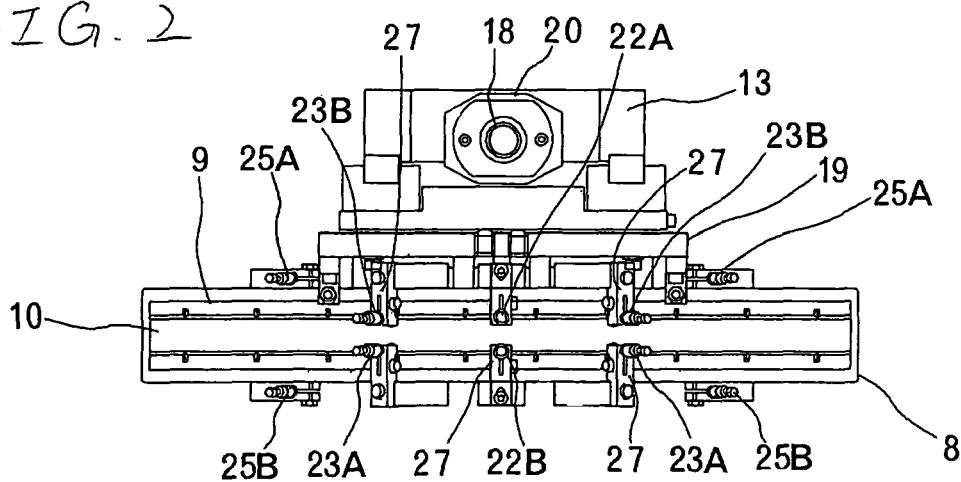
FIG. 2 is a plan view of a ball cup portion.

As shown in FIGS. 2 and 3, the lower limit sensors 23A, 23B are attached respectively two by two inside the ball cup 8 with sandwiching the upper limit sensors 22A (the upper limit sensor which works when the ball cup 8 advances) and 22B (the upper limit sensor which works when the ball cup 8 retreats) in the moving time in the opposite direction so as to face downward slantingly to the vertical direction. The two lower limit sensors 23A which are provided left and right with the upper limit sensor 22B between work when the ball cup 8 advances, and the two lower limit sensors 23B which are provided left and right with the upper limit sensor 22A between works when the ball cup 8 retreats. Namely, two sets of the lower limit sensors, 23A and 23B, are provided for the advance direction and the retreat direction of the movement of the ball cup 8.

If the lower limit sensors 23A, 23B are faced just downward, the lower limit sensors 23A, 23B may receive reflection light from the arraying jig. However, the lower limit sensors 23A, 23B face slantingly to the downside. Therefore, the lower limit sensors 23A, 23B prevent reception of the reflection light. Thus, the lower limit sensors 23A, 23B can determine the presence of the solder ball 5 accurately. Further, the lower limit sensors 23A, 23B also work when the advance direction of the ball cup 8 is reversed. Therefore, the lower limit sensors 23A, 23B are attached to the front side and the back side in the advance direction of the ball cup 8 similarly to the upper limit sensors 22A, 22B.

Both of the upper limit sensors 22A, 22B and the lower limit sensors 23A, 23B sense the reflection light from the solder balls 5 in the ball cup 8. When both of the upper limit sensors 22A, 22B and the lower limit sensors 23A, 23B detect predetermined light quantity of the reflection light, they are turned to an ON-state.

A detection area of the upper limit sensors 22A, 22B, though the upper limit sensor 22B is not shown in FIG. 4, is a position set in a slant surface of the rear wall 24 in the advance direction near the lower opening part 10 in the ball cup 8. On the other hand, as shown in FIG. 4, a detection area of the lower limit sensor 23A, 23B is a portion in the lower opening part near the inner wall on the front side in the advance direction of the ball cup 8, where the conductive balls have not been laminated. Both the upper limit sensors 22A, 22B and the lower limit sensors 23A, 23B are attached to the ball cup 8 through adjusters 27 which can adjust the detection area in the front and back directions.

The detection of the upper limit of the solder ball 5 in the ball cup 8 by the upper limit sensors 22A, 22B is performed by difference in light quantity in the detection area of the upper limit sensors 22A, 22B. When a large number of solder balls 5 exist in the detection area of the upper limit sensors 22A, 22B (when the quantity of the solder balls 5 is too large), a large quantity of light is detected. On the other hand, when the quantity of the solder balls 5 is appropriate, the solder ball 5 does not exist in the detection area. Therefore, the upper limit sensors 22A, 22B detects only a small quantity of light, because the reflection light from the solder ball 5 is not detected. From this difference in light quantity, a determination as to whether the solder ball 5 reaches the upper limit is made. For example, the upper limit sensors 22A, 22B may detect the reaching of the upper limit when the light quantity of the reflection light exceeds a predetermined value.

The detection of the lower limit of the solder ball 5 in the ball cup 8 by the lower limit sensors 23A, 23B is performed also by difference in light quantity in the detection area of the lower limit sensors 23A, 23B. When the quantity of the solder balls 5 is appropriate, since a large number of solder balls 5 exist in the detection area, a large quantity of light is detected by the lower limit sensors 23A, 23B. On the other hand, when the solder balls 5 in the detection area lessen, the portion where the solder ball 5 does not exist increases. Thus, only a small quantity of light is detected. From this difference in light quantity, the lower limit of the solder ball 5 in the ball cup 8 is detected. For example, the lower limit sensors 23A, 23B may detect the reaching of the lower limit when the light quantity of the reflection light falls below a predetermined value.

The leakage sensors 25A, 25B are attached to the back side in the relative movement direction of the ball cup 8, that is, on the outside of the rear wall in the advance direction, as shown in FIG. 5. In the longitudinal direction, the leakage sensors 25A, 25B are provided in two places sandwiching the upper limit sensors 22A, 22B and the lower limit sensors 23A, 23B, as shown in FIG. 2. Similarity to the lower limit sensors 23A, 23B, the leakage sensors 25A, 25B are provided so as to face downward slantingly to the vertical direction, as shown in FIG. 3. Further, in order to work the leakage sensors 25A, 25B when the advance direction of the ball cup 8 is reversed, the leakage sensors 25A and 25B are attached to the front and back sides in the advance direction of the ball cup 8 similarly to the upper limit sensors 22A, 22B and the lower limit sensors 23A, 23B. That is, two sets of the leakage sensors, 25A and 25B, are provided for the advance direction and the retreat direction of the movement of the ball cup 8. The leakage sensor 25A is a detection sensor in the advance time, and the leakage sensor 25B is a detection sensor in the retreat time.

The number of the solder balls 5 flowing out from the ball cup 8 is not one but a large number of the solder balls 5 leaks out so as to flow in the shape of a wide belt. Therefore, it is not necessary to provide the detection position so as to cover the full width in the longitudinal direction of the ball cup 8, but it is enough in the embodiment that the two leakage sensors in each of the front and back directions are provided.

The detection of leakage by the leakage sensors 25A, 25B is performed by difference in light quantity in the detection area of the leakage sensors 25A, 25B. The detection area by the leakage sensors 25A, 25B is larger than the diameter of the solder ball 5. When the solder ball 5 leaks, since a large number of the solder balls exist in the detection area, a large quantity of light is detected by the leakage sensors 25A, 25B. On the other hand, in the normal state where there is no leakage, the leakage sensors 25A, 25B only detect the reflection light from the solder ball 5 inserted into the ball insertion part 4. Therefore, only a small quantity of light is detected. From this difference in light quantity, the leakage of the solder balls 5 is detected.

Three ball hoppers 7 are arranged in the longitudinal direction over the ball-supply opening part 9 of the ball cup 8.

The ball hopper 7 houses a large number of the solder balls 5 in an inner space thereof. The ball hopper 7 includes a supply port from which the housed solder ball 5 is exhausted to the ball cup 8 and a shutter 29 which is opening and closing means which can open and close the supply port. The ball hopper 7 is also attached to the same attachment base 19 as that of the ball cup 8. A reference numeral 30 in the figure denotes a cylinder for actuating the shutter 29. The respective cylinders 30 of the three ball hoppers 7 are actuated in synchronization.

A reception part 32 having a ball detection mechanism is provided under the ball supply port of the ball hopper 7. The solder balls 5 supplied from the ball hopper 7 through the reception part 32 to the ball cup 8 are dispersed substantially uniformly in the longitudinal direction in the ball cup 8. A ball detection sensor 31 provided in the reception part 32 detects the presence of the solder ball 5 to be supplied from the ball supply port of the ball hopper 7 and ball clogging. In the embodiment, a transmission type fiber sensor is used for the ball detection sensor 31.

When the shutter 29 of the ball hopper 7 opens, the ball supply operation is performed. The supply quantity of the solder balls 5 while the shutter 29 is opened is previously measured. Appropriate number of the solder balls 5 is previously supplied to the ball cup 8. The upper limit sensors 22A, 22B and the lower limit sensors 23A, 23B are set so as not to work when the solder balls are supplied from the ball hopper 7 to the ball cup 8 and when the movement of the ball cup 8 stops.

When a state of the lower limit sensor changes from ON to OFF during the producing operation (when the lower limit sensor detects the lower limit), the solder balls 5 is supplied from the ball hopper 7 to the ball cup 8. The shutter 29 is opened and the solder balls 5 in the ball hopper 7 fall from the supply port of the ball hopper 7 into the reception part 32. At this time, the solder balls 5 which have fallen in the reception part 32 are detected by the ball detection sensor 31.

After the predetermined time which has been previously set has passed, the shutter 29 is closed to stop the supply of the solder balls 5. The opening and closing of the shutters 29 of the three ball hoppers 7 are simultaneously controlled. The solder balls 5 which have dropped into the reception parts 32 are supplied through the ball introduction part to the ball cup 8. By repeating these operations, the supply of the solder balls 5 is performed.

On the other hand, when the upper limit sensors 22A, 22B detect that the solder balls 5 exist above the set upper limit, the ball cup 8 moves to the moving end and stops once. Thereafter, alarm is activated. In such case, an operator controls the apparatus to suck up and recovers the solder balls 5 by means of a suction nozzle (not shown). When the number of the solder balls 5 in the ball cup 8 becomes appropriate, the operator restarts the operation of the apparatus. When the leakage sensors 25A, 25B detect the leakage of the solder ball 5 from the ball cup 8, the alarm is also activated and the operation of the apparatus is stopped. Either one of the activating of the alarm or stopping of the operation of the apparatus may be performed. In this case, the ball cup 8 is once evacuated above, and the solder balls 5 are sucked up by the suction nozzle and recovered. When the arraying jig is exchanged, the solder balls 5 may also be recovered in a same manner.

When the moving direction of the ball cup 8 is reversed, operative sensors are switched from the upper limit sensor 22A, the lower limit sensor 23A and the leakage sensor 25A to the upper limit sensor 22B, the lower limit sensor 23B and the leakage sensor 25B. In the embodiment, the ball cup 8 moves and the solder balls 5 are arrayed in the arraying jig. However, as long as the arraying jig and the ball cup are in a relation of the relative movement, the present invention may also be configured such that the ball cup is fixed and the arraying jig moves.

What is claimed is:

1. A conductive ball arraying apparatus comprising:
an arraying jig having ball insertion parts at a predetermined array pattern;
a ball cup that has an opening part on a lower surface thereof and is capable of housing a plurality of conductive balls;
moving means that moves the arraying jig and the ball cup relatively, the moving means moving the ball cup relatively along an upper surface of the arraying jig and dropping off the conductive balls into the ball insertion parts of the arraying jig;
upper limit detection means that detect a quantity of the conductive balls in the ball cup and detects whether the quantity of the conductive balls in the ball cup reaches an upper limit when the moving means moves the arraying jig and the ball cup relatively;
lower limit detection means that detect a quantity of the conductive balls in the ball cup and detects whether the quantity of the conductive balls in the ball cup reaches a lower limit when the moving means moves the arraying jig and the ball cup relatively; and
leakage detection means that detects leakage of the conductive balls from a clearance between the ball cup and the arraying jig on a back side in a relative movement direction of the ball cup, and
wherein the each of the upper limit detection means, lower limit detection means and the leakage detection means includes a pair of means for the advance direction of the ball cup and for the retreat direction of the ball cup such that one of each pair thereof is opposed to another one of each pair thereof in a moving direction of the ball cup.

2. The conductive ball arraying apparatus according to claim 1,
wherein the moving means is movable reciprocately in forward and backward directions so as to move the ball cup in advance and retreat directions,
wherein each of the pairs of the upper limit detection means, the lower limit detection means and the leakage detection means moves integrally with the ball cup and is alternately switched in accordance with the moving direction of the ball cup such that:
one of the pair of the upper limit detection means works when the ball cup moves in the advance direction, and another one of the pair of the upper limit detection means works when the ball cup moves in the retreat direction;
one of the pair of the lower limit detection means works when the ball cup moves in the advance direction, and another one of the pair of the lower limit detection means works when the ball cup moves in the retreat direction; and
one of the pair of the leakage detection means works when the ball cup moves in the advance direction, and another one of the pair of the leakage detection means works when the ball cup moves in the retreat direction.

3. A conductive ball arraying apparatus comprising:
an arraying jig having ball insertion parts at a predetermined array pattern;
a ball cup that has an opening part on a lower surface thereof and is capable of housing a plurality of conductive balls;
moving means that moves the arraying jig and the ball cup relatively, the moving means moving the ball cup relatively along an upper surface of the arraying jig and dropping off the conductive balls into the ball insertion parts of the arraying jig;
lower limit detection means, which is provided to the be moved integrally with the moving means, and which detects a quantity of the conductive balls in the opening part in a vicinity of an inner wall of the ball cup on a side which the ball cup moves so as to detect whether the quantity of the conductive balls in the ball cup reaches the lower limit when the moving means moves the arraying jig and the ball cup relatively;
a ball supply means that supplies the conductive balls into the ball cup so as to resupply the conductive balls when the lower limit detection means detects the reaching of the lower limit,
wherein the moving means is movable reciprocately so as to move the ball cup in advance and retreat directions,
wherein the lower limit detection means includes a pair of means thereof such that a first one of the pair is opposed to a second one of the pair in the moving direction of the ball cup, and wherein each of the pair of the lower limit detection means moves integrally with the ball cup and is alternately switched in accordance with a moving direction of the ball cup such that the first one of the pair of the lower limit detection means works when the ball cup moves in the advance direction and the second one of the pair of the lower limit detection means works when the ball cup moves in the retreat direction.

4. The conductive ball arraying apparatus according to claim 3,
wherein the lower limit detection means detects the quantity of the conductive balls in the ball cup from light quantity of reflection light from the conductive balls.

5. A conductive ball arraying apparatus comprising:
an arraying jig having ball insertion parts at a predetermined array pattern;
a ball cup that has an opening part on a lower surface thereof and is capable of housing a plurality of conductive balls;
moving means that moves the arraying jig and the ball cup relatively, the moving means moving the ball cup relatively along an upper surface of the arraying jig and dropping off the conductive balls into the ball insertion parts of the arraying jig; and
upper limit detection means, which is provided to be moved integrally with the moving means, and which detects a quantity of the conductive balls in a vicinity of an inner wall surface of the ball cup on a side opposite to which the ball cup moves so as to detect whether the quantity of the conductive balls in the ball cup reaches the upper limit when the moving means moves the arraying jig and the ball cup relatively, and
wherein the upper limit detection means includes a pair of the upper limit detection means such that a first one of the pair is opposed to a second one of the pair in the moving direction of the ball cup.

6. The conductive ball arraying apparatus according to claim 5,
wherein the moving means is movable reciprocately in forward and backward directions so as to move the ball cup in advance and retreat directions,
wherein each of the pair of the upper limit detection means is alternately switched in accordance with the moving direction of the ball cup such that the first one of the pair of the upper limit detection means works when the ball cup moves in the advance direction and the second one of the pair of the lower limit detection means works when the ball cup moves in the retreat direction.

7. The conductive ball arraying apparatus according to claim 5,
wherein the upper limit detection means detects the quantity of the conductive balls in the ball cup from light quantity of reflection light from the conductive balls.

8. A conductive ball arraying apparatus comprising:
an arraying jig having ball insertion parts at a predetermined array pattern;
a ball cup that has an opening part on a lower surface thereof and is capable of housing a plurality of conductive balls;
moving means that moves the arraying jig and the ball cup relatively, the moving means moving the ball cup relatively along an upper surface of the arraying jig and dropping off the conductive balls into the ball insertion parts of the arraying jig; and
detection means, which is provided to be moved integrally with the moving means, and which detects a quantity of the conductive balls in the ball cup so as to detect whether the quantity of the conductive balls in the ball cup reaches an upper limit and a lower limit when the moving means moves the arraying jig and the ball cup relatively, and
wherein the detection means includes a pair thereof such that a first one of the pair thereof is opposed to a second one of the pair thereof in a moving direction of the ball cup.

9. The conductive ball arraying apparatus according to claim 8,
wherein the moving means is movable reciprocately in forward and backward directions so as to move the ball cup in advance and retreat directions,
wherein each the pair of the detection means is alternately switched in accordance with the moving direction of the ball cup such that the first one of the pair of the detection means works when the ball cup moves in the advance direction and the second one of the pair of the detection means works when the ball cup moves in the retreat direction.

10. A conductive ball arraying apparatus comprising:
an arraying jig having ball insertion parts at a predetermined array pattern;
a ball cup that has an opening part opposed to the upper surface of the arraying jig on a lower surface thereof and is capable of housing a plurality of conductive balls;
moving means that moves the arraying jig and the ball cup relatively, the moving means moving the ball cup relatively along an upper surface of the arraying jig and dropping off the conductive balls into the ball insertion parts of the arraying jig; and
leakage detection means that detects leakage of the conductive balls from a clearance between the ball cup and the arraying jig on a back side in a relative movement direction of the ball cup, and
wherein the moving means is movable reciprocately in forward and backward directions so as to move the ball cup in advance and retreat directions,
wherein the leakage detection means includes a pair thereof, such that a first one of the pair thereof is for the advance direction of the ball cup and a second one of the pair thereof is for the retreat direction of the ball cup, and
wherein each of the pair of the leakage detection means is alternately switched in accordance with a moving direction of the ball cup such that the first one of the pair of the leakage detection means works when the ball cup moves in the advance direction and the second one of the pair of the leakage detection means works when the ball cup moves in the retreat direction.

11. The conductive ball arraying apparatus according to claim 10, further comprising alarm means that activates an alarm when the leakage detection means detects the leakage of the conductive balls.

12. The conductive ball arraying apparatus according to claim 10, further comprising stopping means that stops the arraying operation when the leakage detection means detects the leakage of the conductive balls.

* * * * *